(12) United States Patent
Deng et al.

(10) Patent No.: US 9,305,913 B1
(45) Date of Patent: Apr. 5, 2016

(54) ELECTROSTATIC DISCHARGE PROTECTION STRUCTURE

(71) Applicant: Episil Technologies Inc., Hsinchu (TW)

(72) Inventors: Jing-Sheng Deng, Hsinchu (TW); Te-Kun Liu, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 0 days.

(21) Appl. No.: 14/828,510

(22) Filed: Aug. 17, 2015

(30) Foreign Application Priority Data

May 29, 2015 (TW) .............................. 104117475 A (51) Int. Cl.
*H01L 29/02* (2006.01)
*H01L 27/02* (2006.01)
*H01L 29/06* (2006.01)

(52) U.S. Cl.
CPC ........ *H01L 27/0251* (2013.01); *H01L 29/0646* (2013.01)

(58) Field of Classification Search
CPC .................................................. H01L 29/0646
USPC ........................................................ 257/487
See application file for complete search history.

(56) References Cited

U.S. PATENT DOCUMENTS 7,098,509 B2    8/2006  Zdebel et al.
8,553,380 B2    10/2013  Salcedo

FOREIGN PATENT DOCUMENTS

| TW | 359021 | 5/1999 |
| TW | 201027708 | 7/2010 |
| TW | 201214667 | 4/2012 |
| TW | 201436159 | 9/2014 |

*Primary Examiner* — Douglas Menz
(74) *Attorney, Agent, or Firm* — Jianq Chyun IP Office (57) ABSTRACT

An ESD protection structure includes a first conductive type substrate; first and second well regions of a first conductive type; a third well region of a second conductive type located between the first and second well regions; a first doped region of the first conductive type and a second doped region of the second conductive type disposed in the first well region; a third doped region of the first conductive type and a fourth doped region of the second conductive type disposed in the second well region; and fifth and sixth doped regions disposed at an interface of the first and third well regions or an interface of the second and third well regions. The fifth doped region of the first conductive type is located in the first or second well region, and the sixth doped region of the second conductive type is located in the third well region.

20 Claims, 5 Drawing Sheets

ELECTROSTATIC DISCHARGE PROTECTION STRUCTURE

CROSS REFERENCE TO RELATED APPLICATION

This application claims the priority benefit of Taiwan application serial no. 104117475, filed on May 29, 2015. The entirety of the above-mentioned patent application is hereby incorporated by reference herein and made a part of specification.

BACKGROUND OF THE INVENTION

1. Field of the Invention

The invention relates to a semiconductor element, and more particularly, to an electrostatic discharge protection structure.

2. Description of Related Art

Electrostatic discharge (ESD) is a phenomenon of having a rapid flow of discharge via a discharge path within a short period of time after charges are accumulated on a non-conductor or an ungrounded conductor. For instance, human bodies, machines for packaging integrated circuits and instruments for testing the integrated circuits are all commonly known charged bodies, and when a charge body is in contact with a chip, it is possible to discharge to the chip. The process of discharging will generate several amperes of instantaneous discharge current within a period of time, which is as short as several hundred nanoseconds (ns), and thereby causes the integrated circuit in the chip to be damaged or invalided. Therefore, the integrated circuit of the chip is generally configured with an electrostatic discharge protection circuit to prevent the electrostatic discharge phenomenon from damaging the internal circuit.

Figure 1:
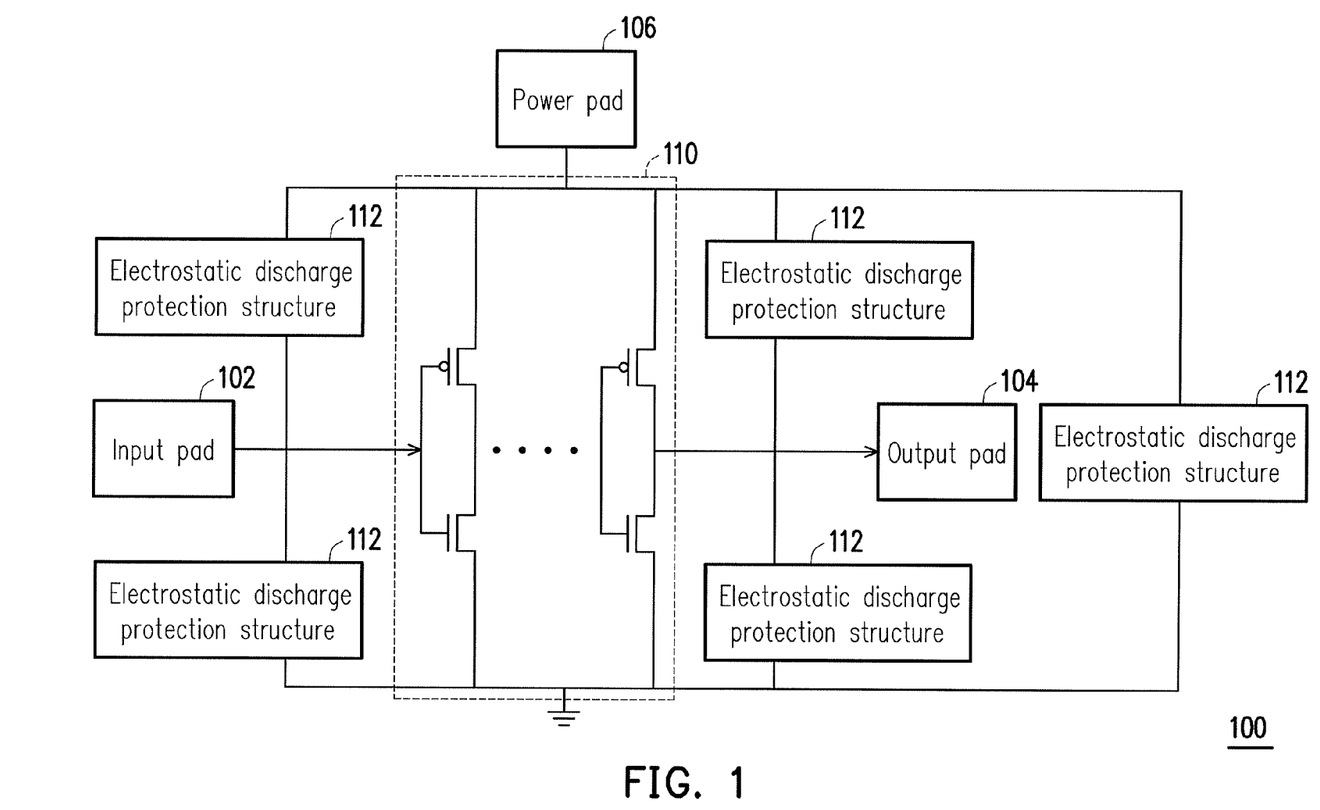
FIG. 1 is a conventional configuration diagram illustrating a use of an electrostatic discharge protection structure to protect an internal circuit.

FIG. 1 is a conventional configuration diagram illustrating a use of an electrostatic discharge protection structure to protect an internal circuit. As shown in FIG. 1, the design of the electrostatic discharge protection circuit 100 must consider all the possible electrostatic discharge paths, so as to protect the internal circuit 110. Therefore, electrostatic discharge protection structures 112 must be disposed between an input pad 102 and a power pad 106, between an output pad 104 and the power pad 106, between the input pad 102 and a ground voltage, between the output pad 104 and the ground voltage, and between the power pad 106 and the ground voltage.

In general, a breakdown voltage of the electrostatic discharge protection circuit will be lower than a breakdown voltage of a main circuit. However, in different circuits, breakdown voltages required by the electrostatic discharge protection elements may be different. Therefore, how to design an electrostatic discharge protection circuit capable of adjusting a breakdown voltage thereof in compliance with the requirements of various circuits has become a major issue for current research.

SUMMARY OF THE INVENTION

The invention is directed to an electrostatic discharge protection structure, which is capable of adjusting a breakdown voltage thereof to meet the requirements of various circuits.

The invention is directed to an electrostatic discharge protection structure including a substrate, a first well region, a second well region, a third well region, a first doped region. a second doped region, a third doped region, a fourth doped region, a fifth doped region and a sixth doped region. The substrate has a first conductive type. The first well region and the second well region have the first conductive type and are disposed separately on the substrate. The third well region has a second conductive type, and is disposed on the substrate and located between the first well region and the second well region. The first doped region has the first conductive type and is disposed in the first well region. The second doped region has the second conductive type and is disposed in the first well region. The third doped region has the first conductive type and is disposed in the second well region. The fourth doped region has the second conductive type and is disposed in the second well region. The fifth doped region and the sixth doped region are disposed adjacent to each other at one of an interface of the first well region and the third well region and an interface of the second well region and the third well region. The fifth doped region has the first conductive type and is located in the first well region or the second well region, and the sixth doped region has the second conductive type and is located in the third well region.

In one embodiment of the invention, when the fifth doped region is located in the first well region, the fifth doped region and the first doped region are disposed separately, and when the fifth doped region is located in the second well region, the fifth doped region and the third doped region are disposed separately.

In one embodiment of the invention, the fifth doped region can partially extend into the third well region, or the sixth doped region can partially extend into the first well region or the second well region.

In one embodiment of the invention, the fifth doped region and the sixth doped region can be separated from each other, in contact with each other, or overlapped with each other.

In one embodiment of the invention, at least one of the first doped region through the sixth doped region can be disposed to surround the first well region, and a surrounding manner for at least one of the first doped region through the sixth doped region can include a closed type or an open type.

In one embodiment of the invention, the electrostatic discharge protection structure further includes a seventh doped region and an eighth doped region, which are disposed adjacent to each other at the other one of the interface of the first well region and the third well region and the interface of the second well region and the third well region. The seventh doped region has the first conductive type and is located in the first well region or the second well region, and the eighth doped region has the second conductive type and is located in the third well region.

In one embodiment of the invention, when the seventh doped region is located in the first well region, the seventh doped region and the first doped region are disposed separately, and when the seventh doped region is located in the second well region, the seventh doped region and the third doped region are disposed separately.

In one embodiment of the invention, the seventh doped region can partially extend into the third well region, or the eighth doped region can partially extend into the first well region or the second well region.

In one embodiment of the invention, the seventh doped region and the eighth doped region can be separated from each other, in contact with each other, or overlapped with each other.

In one embodiment of the invention, at least one of the seventh doped region and the eighth doped region can be disposed to surround the first well region, and a surrounding manner for at least one of the seventh doped region and the eighth doped region can include a closed type or an open type.

In one embodiment of the invention, the second doped region can be located between the first doped region and the third well region, or the first doped region can be located between the second doped region and the third well region second doped region.

In one embodiment of the invention, the third doped region can be located between the fourth doped region and the third well region, or the fourth doped region can be located between the third doped region and the third well region.

In one embodiment of the invention, the first doped region and the second doped region can be electrically connected to a pad, and the third doped region and the fourth doped region can be electrically connected to a conductive line.

In one embodiment of the invention, the pad is, for example, an input pad, an output pad or a power pad.

In one embodiment of the invention, the conductive line is, for example, grounded.

In one embodiment of the invention, the first doped region and the second doped region are, for example, located underneath the pad.

In one embodiment of the invention, the electrostatic discharge protection structure further includes a buried layer. The buried layer has the second conductive type and is disposed between the substrate and the first well region and between the substrate and the second well region.

In one embodiment of the invention, the electrostatic discharge protection structure further includes at least one field oxide layer. The field oxide layer is disposed in the first well region at a side of the first doped region far away from the third well region and/or disposed in the third well region.

In one embodiment of the invention, the first well region, the second well region and the third well region are, for example, originated from a same epitaxial layer or from the substrate.

In one embodiment of the invention, the first conductive type is, for example, one of an N-type conductive type and a P-type conductive type, and the second conductive type is, for example, the other one of the N-type conductive type and the P-type conductive type.

In view of above, in the electrostatic discharge protection structure of the invention, the breakdown voltage of the electrostatic discharge protection structure can be adjusted through changing the dispositions of the fifth doped region and the sixth doped region, so as to meet the requirements of various circuits.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2A:
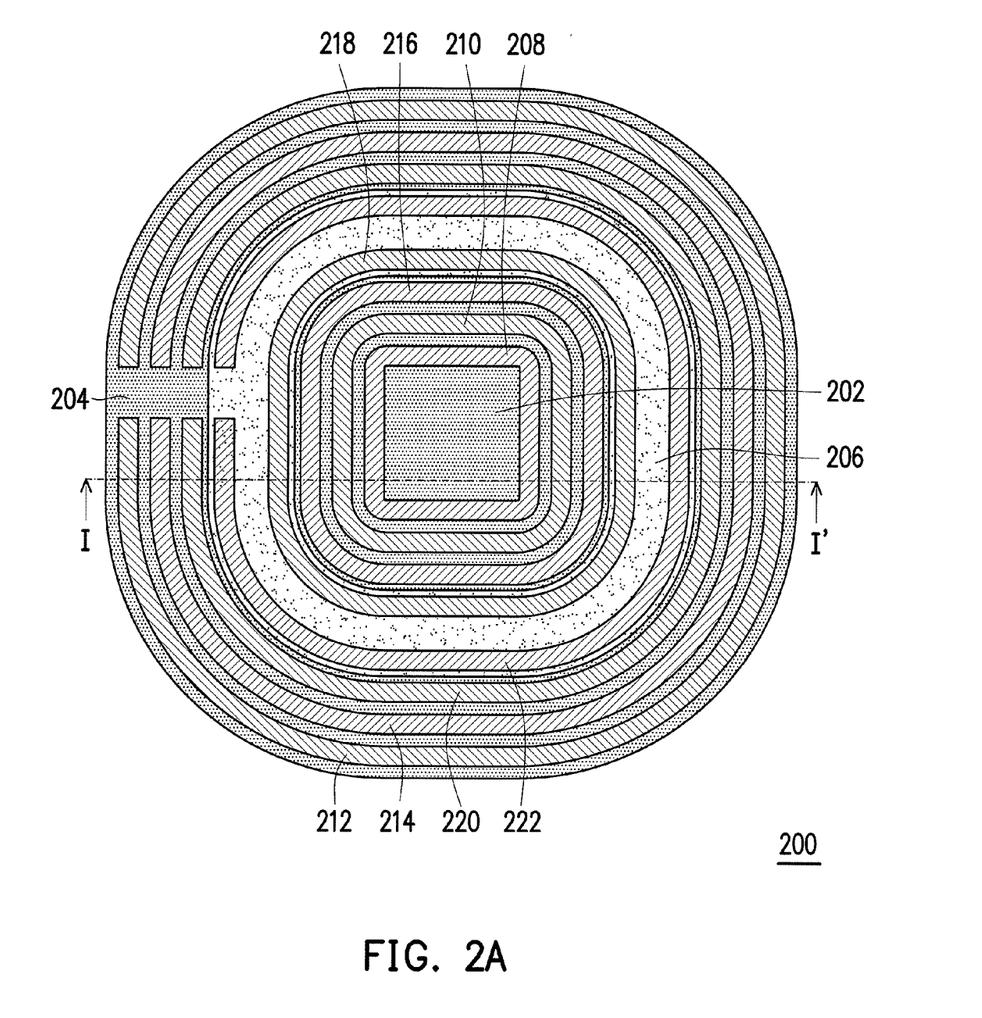
FIG. 2A is a top view diagram illustrating an electrostatic discharge protection structure according to an embodiment of the invention.
Figure 2B:
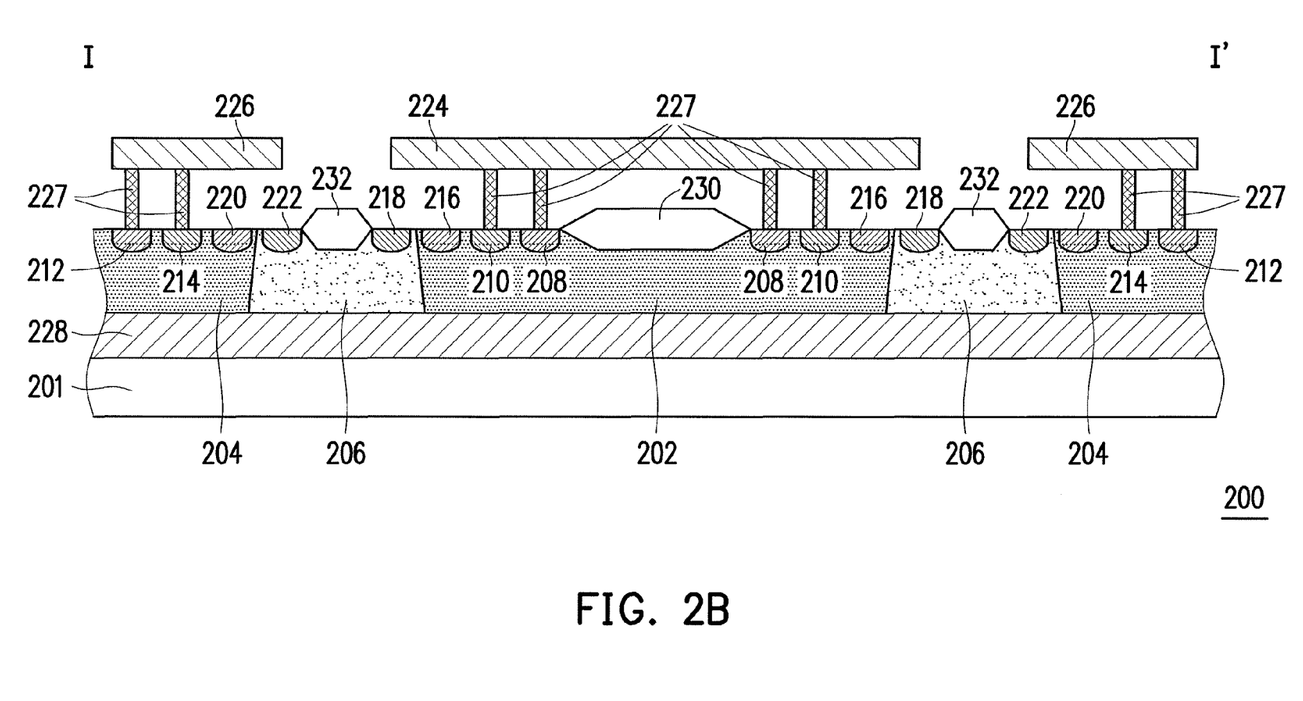
FIG. 2B is a cross-sectional diagram illustrating an electrostatic discharge protection structure according to an embodiment of the invention.

FIG. 2A is a top view diagram illustrating an electrostatic discharge protection structure according to an embodiment of the invention. FIG. 2B is a cross-sectional diagram illustrated along an I-I' section line in FIG. 2A. In order to enable those skilled in the art to specifically understand the configurations of the doped regions in the present embodiment, illustrations of pad, conductive line and field oxide layer are omitted in FIG. 2A.

Referring to FIG. 2A and FIG. 2B, an electrostatic discharge protection structure 200 includes a substrate 201, a first well region 202, a second well region 204, a third well region 206, a first doped region 208, a second doped region 210, a third doped region 212, a fourth doped region 214, a fifth doped region 216 and a sixth doped region 218.

In the present embodiment, 'a first conductive type' and 'a second conductive type' are different conductive types. That is, the first conductive type is, for example, one of an N-type conductive type and a P-type conductive type, and the second conductive type is, for example, the other one of the N-type conductive type and the P-type conductive type. For instance, when the first conductive type is the P-type conductive type, then the second conductive type is the N-type conductive type, and vice versa.

The substrate 201 has the first conductive type. The substrate 201 is, for example, a silicon substrate. In the present embodiment, the substrate 201 is described using a P-type substrate for an example. In other embodiments, the substrate 201 may also be an N-type substrate.

The first well region 202 and the second well region 204 have the first conductive type and are disposed separately on the substrate. In the present embodiment, the second well region 204 is described as surrounding the first well region 202 for an example, but the invention is not limited thereto. In other embodiments, the second well region 204 may also not surround the first well region 202.

The third well region 206 has the second conductive type and is disposed on the substrate 201. The third well region 206 is located between the first well region 202 and the second well region 204. In the present embodiment, the third well region 206 is described as surrounding the first well region 202, but the invention is not limited thereto. In other embodiments, the third well region 206 may also not surround the first well region 202.

The first well region 202 and the second well region 204 have the first conductive type, while the third well region 206 has the second conductive type. In the present embodiment, the first well region 202, the second well region 204 and the third well region 206 are, for example, originated from a same epitaxial layer, but the invention is not limited thereto. A forming method of the first well region 202, the second well region 204 and the third well region 206 is, for example, as described in the following. First, an epitaxial layer of the second conductive type is formed, and a portion of the epitaxial layer of the second conductive type can be used as the third well region 206. Next, a first conductive type doping is performed on the epitaxial layer of the second conductive type through using an ion implantation process, so as to form the first well region 202 and the second well region 204.

In other embodiments, the first well region 202, the second well region 204 and the third well region 206 may also originate from the substrate 201. Now, the forming method of the first well region 202, the second well region 204 and the third well region 206 is, for example, to respectively perform a first conductive type doping or a second conductive type doping on the substrate 201 through using an ion implantation process.

In the present embodiment, the first well region 202 and the second well region 204 are described using P-type well regions and the third well region 206 is described using a N-type well region for an example. In other embodiments, the first well region 202 and the second well region 204 may also be the N-type well regions, and the third well region 206 may also be the P-type well region.

The first doped region 208 and the second doped region 210 are disposed in the first well region 202. The first doped region 208 has the first conductive type, while the second doped region 210 has the second conductive type. In the present embodiment, the second doped region 210 is located between the first doped region 208 and the third well region 206, but the invention is not limited thereto. In other embodiments, the dispositions of the first doped region 208 and the second doped region 210 may also be changed, such as by disposing the first doped region 208 between the second doped region 210 and the third well region 206.

The third doped region 212 and the fourth doped region 214 are disposed in the second well region 204. The third doped region 212 has the first conductive type, while the fourth doped region 214 has the second conductive type. In the present embodiment, the fourth doped region 214 is located between the third doped region 212 and the third well region 206, but the invention is not limited thereto. In other embodiments, the dispositions of the third doped region 212 and the fourth doped region 214 may also be changed, such as by disposing the third doped region 212 between the fourth doped region 214 and the third well region 206.

The fifth doped region 216 and the sixth doped region 218 are disposed adjacent to each other at one of an interface of the first well region 202 and the third well region 206 and an interface of the second well region 204 and the third well region 206, so as to adjust a breakdown voltage of the electrostatic discharge protection structure 200. The fifth doped region 216 has the first conductive type and is located in the first well region 202 or the second well region 204. The sixth doped region 218 has the second conductive type and is located in the third well region 206. In the present embodiment, the fifth doped region 216 and the sixth doped region 218 are described as being adjacent to each other at the interface of the first well region 202 and the third well region 206 for an example. Now, the fifth doped region 216 is, for example, disposed in the first well region 202, and the sixth doped region 218 is, for example, disposed in the third well region 206. In the present embodiment, when the fifth doped region 216 is located in the first well region 202, the fifth doped region 216 and the first doped region 208 are, for example, disposed separately. In another embodiment, when the fifth doped region 216 is located in the second well region 204, the fifth doped region 216 and the third doped region 212 are, for example, disposed separately.

Figure 2C:
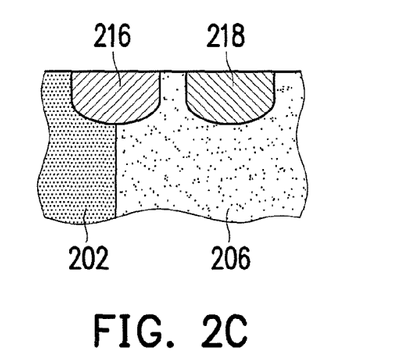
FIG. 2C through FIG. 2H are schematic diagrams illustrating disposition relationships between a fifth doped region and a sixth doped region of FIG. 2B according to other embodiments of the invention.
Figure 2D:
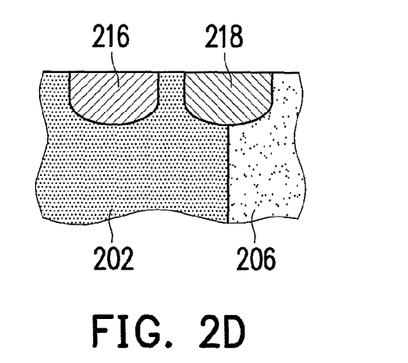
Figure 2E:
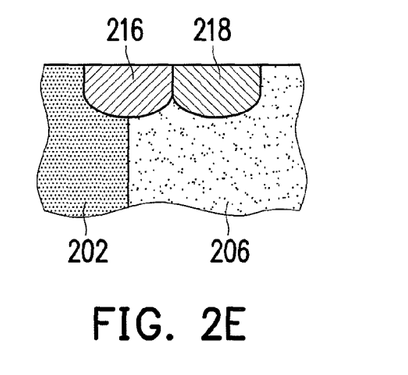
Figure 2F:
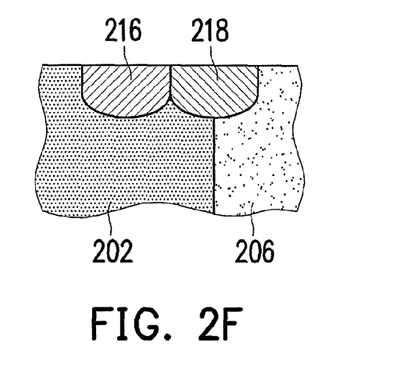
Figure 2G:
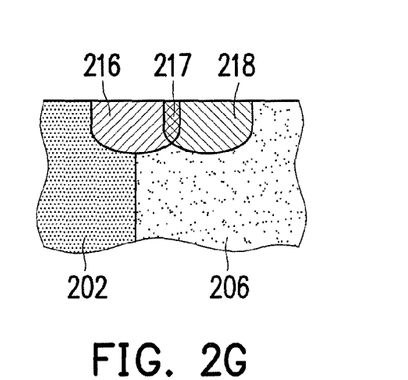
Figure 2H:
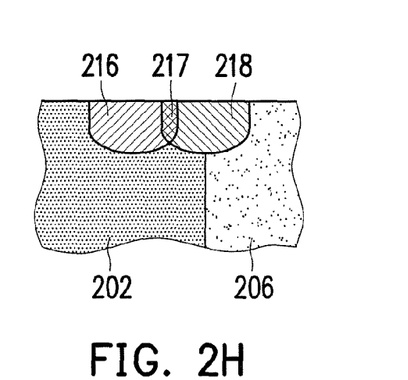

In addition, referring to FIG. 2B through FIG. 2H at the same time, the dispositions of the fifth doped region 216 and the sixth doped region 218 are not specifically limited, such that it is within the scope of the invention as long as the fifth doped region 216 and the sixth doped region 218 are disposed adjacent to each other at one of the interface of the first well region 202 and the third well region 206 and the interface of the second well region 204 and the third well region 206. For instance, the fifth doped region 216 and the sixth doped region 218 can respectively be disposed in the first well region 202 and the third well region 206 (as shown in FIG. 2B). In other embodiments, the fifth doped region 216 can partially extend into the third well region 206 (as shown in FIG. 2C, FIG. 2E and FIG. 2G), or the sixth doped region 218 can partially extend into the first well region 202 (as shown in FIG. 2D, FIG. 2F and FIG. 2H). In addition, the fifth doped region 216 and the sixth doped region 218 can be separated from each other (as shown in FIG. 2B through FIG. 2D), in contact with each other (as shown in FIG. 2E and FIG. 2F) or overlapped with each other to form an overlapping region 217 (as shown in FIG. 2G and FIG. 2H). The breakdown voltage of the electrostatic discharge protection structure can be adjusted by adjusting the dispositions of the fifth doped region 216 and the sixth doped region 218 (such as adjusting a distance between the fifth doped region 216 and the sixth doped region 218 or adjusting the position of the two, etc), so as to meet the requirements of various circuits.

Referring to FIG. 2A and FIG. 2B, the electrostatic discharge protection structure 200 may further include a seventh doped region 220 and an eighth doped region 222, so as to further adjust the breakdown voltage of the electrostatic discharge protection structure 200. The seventh doped region 220 and the eighth doped region 222 are disposed adjacent to each other at the other one of the interface of the first well region 202 and the third well region 206 and the interface of the second well region 204 and the third well region 206. The seventh doped region 220 has the first conductive type and is located in the first well region 202 or the second well region 204. The eighth doped region 222 has the second conductive type and is located in the third well region 206. In the present embodiment, the seventh doped region 220 and the eighth doped region 222 are described as being disposed adjacent to each other at the interface of the second well region 204 and the third well region 206 for an example. Now, the seventh doped region 220 is, for example, disposed in the second well region 204, and the eighth doped region 222 is, for example, disposed in the third well region 206. In the present embodiment, when the seventh doped region 220 is located in the second well region 204, the seventh doped region 220 and the third doped region 212 are, for example, disposed separately. In another embodiment, when the seventh doped region 220 is located in the first well region 202, the seventh doped region 220 and the first doped region 208 are, for example, disposed separately.

In addition, the seventh doped region 220 and the eighth doped region 220 can be separated from each other, in contact with each other or overlapped with each other. The seventh doped region 220 can partially extend into the third well region 206, or the eighth doped region 222 can partially extend into the second well region 204. For instance, the dispositions of the seventh doped region 220 and the eighth doped region 222 can be referred to the descriptions regarding the dispositional relationship for the fifth doped region 216 and the sixth doped region 218 shown in FIG. 2B through FIG. 2H. The breakdown voltage of the electrostatic discharge protection structure 200 can further be adjusted by adjusting the dispositions of the seventh doped region 220 and the eighth doped region 222 (such as adjusting a distance between the seventh doped region 220 and the eighth doped region 222 or the position of the two), so as to meet the requirements of the various circuits.

A forming method of the first doped region 208 through the eighth doped region 222 is, for example, ion implantation. In the present embodiment, the first doped region 208, the third doped region 212, the fifth doped region 216 and the seventh doped region 220 are, for example, P-type heavy doped regions, and the second doped region 210, the fourth doped region 214, the sixth doped region 218 and the eighth doped region 222 are, for example, N-type heavy doped regions. In anther embodiment, when the first well region 202 and the second well region 204 are the N-type well regions and the third well region 206 is the P-type well region, the first doped region 208, the third doped region 212, the fifth doped region 216 and the seventh doped region 220 may also be the N-type heavy doped regions, and the second doped region 210, the fourth doped region 214, the sixth doped region 218 and the eighth doped region 222 may be the P-type heavy doped regions.

Moreover, at least one of the first doped region 208 through the eighth doped region 222 can be disposed to surround the first well region 202, and a surrounding manner for at least one of the first doped region 208 through the eighth doped region 222 is, for example, a closed type or an open type. In the present embodiment, the first doped region 208 through the eighth doped region 222 are, for example, disposed to surround the first well region 202, but the invention is not limited thereto. In other embodiments, the first doped region 208 through the eighth doped region 222 may also not surround the first well region 202. In addition, the surrounding manner for at least one of the first doped region 208 through the eighth doped region 222 can be the closed type or the open type. In the present embodiment, surrounding manners for the first doped region 208, the second doped region 210, the fifth doped region 216 and the sixth doped region 218 are, for example, the closed type, and surrounding manners for the third doped region 212, the fourth doped region 214, the seventh doped region 220 and the eighth doped region 222 are, for example, the open type, but the invention is not limited to. Those skilled in the art should be able to determine whether the first doped region 208 through the eighth doped region 222 are to surround the first well region 202 and determine the surrounding manners thereof according to the requirements of product design.

In addition, the electrostatic discharge protection structure 200 may further include at least one of a conductor layer 224, a conductive line 226, a buried layer 228 and field oxide layers 230 and 232.

The conductor layer 224 may be used as a pad or a conductor layer for electrically connecting with the pad. In the present embodiment, the conductor layer 224 is described using a pad for an example. The first doped region 208 and the second doped region 210 may be electrically connected to the conductor layer 224 (pad) through the plug 227. The conductor layer 224 is, for example, an input pad, an output pad or a power pad. The first doped region 208 and the second doped region 210 may be disposed underneath the conductor layer 224 (pad), thereby saving a layout area occupied by the electrostatic discharge protection circuit 200. A material of the conductor layer 224 is, for example, copper or tungsten. A forming method of the conductor layer 224 is, for example, damascene or a combination of lithography, deposition process and etching process.

The conductive line 226 is, for example, grounded. The conductive line 226 may be used as a grounding conductive line or a conductive line for electrically connecting to the grounding conductive line. The third doped region 212 and the fourth doped region 214 may be electrically connected to the conductive line 226 through the plug 227. A material of the conductive line 226 is, for example, copper or tungsten. A forming method of the conductive line 226 is, for example, damascene or a combination of lithography, deposition process and etching process.

The buried layer 228 is disposed between the substrate 201 and the first well region 202 and between the substrate 201 and the second well region 204, so as to isolate the substrate 201 from the first well region 202 and to isolate the substrate 201 from the second well region 204. The buried layer 228 has the second conductive type. In the present embodiment, the buried layer 228 is described using an N-type buried layer for an example. In another embodiment, the buried layer 228 may also be a P-type buried layer. In addition, the buried layer 228 may further extend in between the substrate 201 and the third well region 206. A forming method of the buried layer 228 is, for example, ion implantation.

The field oxide layer 230 is disposed in the first well region 202 at a side of the first doped region 208 far away from the third well region 206. The field oxide layer 232 is disposed in the third well region 206. In the present embodiment, the first doped region 208 is, for example, surrounding the field oxide layer 230, and the field oxide layer 232 is, for example, located between the sixth doped region 218 and the eighth doped region 222. A material of the field oxide layers 230 and 232 is, for example, silicon oxide. A forming method of the field oxide layers 230 and 232 is, for example, thermal oxidation.

In the above embodiment, static electricity from the conductor layer 224 may be discharged via a path through the plug 227, the first doped region 208, the first well region 202, the third well region 206, the second well region 204, the fourth doped region 214, the plug 227 to the conductive line 226. In addition, static electricity from the conductive line 226 may be discharged via a path through the plug 227, the third doped region 212, the second well region 204, the third well region 206, the first well region 202, the second doped region 210, the plug 227 to the conductor layer 224. With the aforementioned electrostatic discharge paths, damages to the internal circuits by the static electricity can be avoided.

Based on the above embodiment, it can be know that the breakdown voltage of the electrostatic discharge protection structure 200 can be adjusted through changing the dispositions of the fifth doped region 216 and the sixth doped region 218, so as to meet the requirements of the various circuits.

Figure 3:
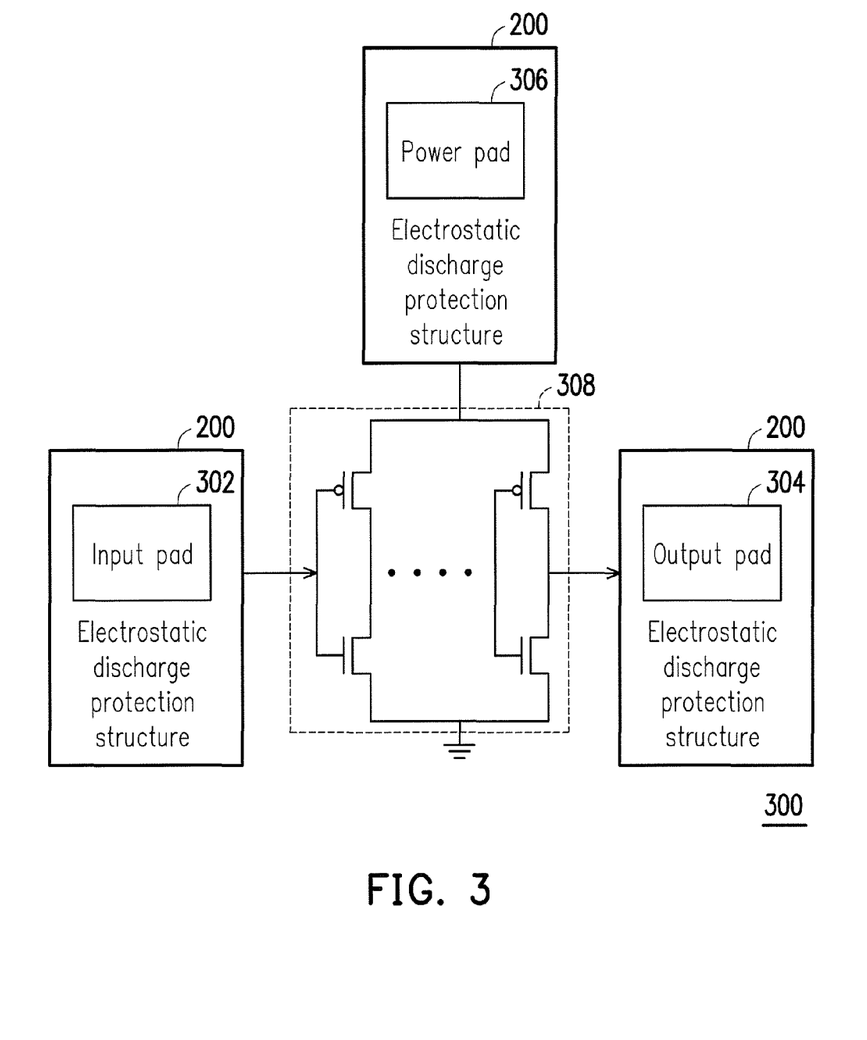
FIG. 3 is a configuration diagram illustrating a use of an electrostatic discharge protection structure to protect an internal circuit according to an embodiment of the invention.

FIG. 3 is a configuration diagram illustrating a use of an electrostatic discharge protection structure to protect an internal circuit according to an embodiment of the invention.

Referring to FIG. 3, in an electrostatic discharge protection circuit 300, when a plurality of electrostatic discharge protection structures 200 are designed to be around the input pad 302, the output pad 304 and the power pad 306, so as to completely protect an internal circuit 308. The structure of the electrostatic discharge protection structure 200 can be referred back to the previous descriptions regarding FIG. 2A to FIG. 2H. As compared to the conventional configuration of the electrostatic discharge protection circuit 100 of FIG. 1, the electrostatic discharge protection circuit 300 of the present embodiment reduces the number of the electrostatic discharge protection structures 200 that is being required, thereby saving the layout area occupied by the electrostatic discharge protection structures 200.

In summary, the above embodiment at least has the following features. In the electrostatic discharge protection structures of the above embodiment, the breakdown voltage of the electrostatic discharge protection structure may be adjusted through changing the dispositions of the fifth doped region and the sixth doped region, so as to meet the requirements of the various circuits.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection structure, comprising:
    a substrate, having a first conductive type;
    a first well region and a second well region, having the first conductive type and disposed separately on the substrate;
    a third well region, having a second conductive type, disposed on the substrate and located between the first well region and the second well region;
    a first doped region, having the first conductive type and disposed in the first well region;
    a second doped region, having the second conductive type and disposed in the first well region;
    a third doped region, having the first conductive type and disposed in the second well region;
    a fourth doped region, having the second conductive type and disposed in the second well region; and
    a fifth doped region and a sixth doped region, disposed adjacent to each other at one of an interface of the first well region and the third well region and an interface of the second well region and the third well region, wherein the fifth doped region has the first conductive type and is located in the first well region or the second well region, and the sixth doped region has the second conductive type and is located in the third well region.

2. The electrostatic discharge protection structure as recited in claim 1, wherein
    when the fifth doped region is located in the first well region, the fifth doped region and the first doped region are disposed separately, and
    when the fifth doped region is located in the second well region, the fifth doped region and the third doped region are disposed separately.

3. The electrostatic discharge protection structure as recited in claim 1, wherein the fifth doped region is partially extended into the third well region, or the sixth doped region is partially extended into the first well region or the second well region.

4. The electrostatic discharge protection structure as recited in claim 1, wherein the fifth doped region and the sixth doped region are separated from each other, in contact with each other, or overlapped with each other.

5. The electrostatic discharge protection structure as recited in claim 1, wherein at least one of the first doped region through the sixth doped region is disposed to surround the first well region, and a surrounding manner for at least one of the first doped region through the sixth doped region comprises a closed type or an open type.

6. The electrostatic discharge protection structure as recited in claim 1, further comprising a seventh doped region and an eighth doped region, disposed adjacent to each other at the other one of the interface of the first well region and the third well region and the interface of the second well region and the third well region, wherein the seventh doped region has the first conductive type and is located in the first well region or the second well region, and the eighth doped region has the second conductive type and is located in the third well region.

7. The electrostatic discharge protection structure as recited in claim 6, wherein
    when the seventh doped region is located in the first well region, the seventh doped region and the first doped region are disposed separately, and
    when the seventh doped region is located in the second well region, the seventh doped region and the third doped region are disposed separately.

8. The electrostatic discharge protection structure as recited in claim 6, wherein the seventh doped region is partially extended into the third well region, or the eighth doped region is partially extended into the first well region or the second well region.

9. The electrostatic discharge protection structure as recited in claim 6, wherein the seventh doped region and the eighth doped region are separated from each other, in contact with each other, or overlapped with each other.

10. The electrostatic discharge protection structure as recited in claim 6, wherein the at least one of seventh doped region and the eighth doped region is disposed to surround the first well region, and a surrounding manner for the at least one of the seventh doped region and the eighth doped region comprises a closed type or an open type.

11. The electrostatic discharge protection structure as recited in claim 1, wherein the second doped region is located between the first doped region and the third well region, or the first doped region is located between the second doped region and the third well region.

12. The electrostatic discharge protection structure as recited in claim 1, wherein the third doped region is located between the fourth doped region and the third well region, or the fourth doped region is located between the third doped region and the third well region.

13. The electrostatic discharge protection structure as recited in claim 1, wherein the first doped region and the second doped region are electrically connected to a pad, and the third doped region and the fourth doped region are electrically connected to a conductive line.

14. The electrostatic discharge protection structure as recited in claim 13, wherein the pad comprises an input pad, an output pad, or a power pad.

15. The electrostatic discharge protection structure as recited in claim 13, wherein the conductive line is grounded.

16. The electrostatic discharge protection structure as recited in claim 13, wherein the first doped region and the second doped region are located underneath the pad.

17. The electrostatic discharge protection structure as recited in claim 1, further comprising a buried layer, having a second conductive type and disposed between the substrate and the first well region and between the substrate and the second well region.

18. The electrostatic discharge protection structure as recited in claim 1, further comprising at least one field oxide layer disposed in the first well region at a side of the first doped region far away from the third well region and/or disposed in the third well region.

19. The electrostatic discharge protection structure as recited in claim 1, wherein the first well region, the second well region and the third well region are originated from a same epitaxial layer or from the substrate.

20. The electrostatic discharge protection structure as recited in claim 1, wherein the first conductive type is one of an N-type conductive type and a P-type conductive type, and the second conductive type is the other one of the N-type conductive type and the P-type conductive type.

\* \* \* \* \*